United States Patent
Yamaguchi et al.

(10) Patent No.: US 8,664,773 B2
(45) Date of Patent: Mar. 4, 2014

(54) MOUNTING STRUCTURE OF SEMICONDUCTOR PACKAGE COMPONENT AND MANUFACTURING METHOD THEREFOR

(75) Inventors: Atsushi Yamaguchi, Osaka (JP); Hideyuki Tsujimura, Kyoto (JP); Hiroe Kowada, Osaka (JP); Ryo Kuwabara, Osaka (JP); Naomichi Ohashi, Hyogo (JP)

(73) Assignee: Panasonic Corporation, Osaka (JP)

(*) Notice: Subject to any disclaimer, the term of this patent is extended or adjusted under 35 U.S.C. 154(b) by 8 days.

(21) Appl. No.: 13/477,524

(22) Filed: May 22, 2012

(65) Prior Publication Data

US 2012/0299202 A1    Nov. 29, 2012

(30) Foreign Application Priority Data

May 23, 2011    (JP) .................................. 2011-114459

(51) Int. Cl.
  *H01L 21/58*    (2006.01)
  *H01L 21/60*    (2006.01)
  *H01L 23/488*   (2006.01)
(52) U.S. Cl.
  USPC .... 257/779; 257/737; 257/738; 257/E23.023; 438/613; 438/118
(58) Field of Classification Search
  USPC ................................................ 257/779, 787
  See application file for complete search history.

(56) References Cited

U.S. PATENT DOCUMENTS

| | | | |
|---|---|---|---|
| 7,227,086 B2* | 6/2007 | Lee et al. ...................... | 174/521 |
| 2004/0032468 A1* | 2/2004 | Killmeier et al. ............... | 347/85 |
| 2011/0108997 A1* | 5/2011 | Ohashi et al. .................. | 257/782 |

FOREIGN PATENT DOCUMENTS

JP    2010-258173 A    11/2010

* cited by examiner

*Primary Examiner* — Marcos D. Pizarro
*Assistant Examiner* — Quinton Brasfield
(74) *Attorney, Agent, or Firm* — RatnerPrestia

(57) ABSTRACT

A manufacturing method for a mounting structure of a semiconductor package component, including: applying a first adhesive with viscosity η1 and a thixotropy index T1 at a position on the substrate, which is on an outer side of the mounted semiconductor package component; applying, on the first adhesive, a second adhesive with viscosity η2 and a thixotropy index T2 so that the second adhesive gets in contact with an outer periphery part of the semiconductor package component; and forming, through a subsequent reflow process, a first adhesive part of the hardened first adhesive and a second adhesive part of the hardened second adhesive, wherein the first and second adhesives satisfy 30≤η2≤η1≤300 (Pa·s) and 3≤T2≤T1≤7, and sectional area S1 of the first adhesive part and sectional area S2 of the second adhesive part with respect to a direction perpendicular to a mounting surface of the substrate satisfy a relation S1≤S2.

4 Claims, 11 Drawing Sheets

MOUNTING STRUCTURE OF SEMICONDUCTOR PACKAGE COMPONENT AND MANUFACTURING METHOD THEREFOR

BACKGROUND OF THE INVENTION

1. Field of the Invention

The present invention relates to mounting of semiconductor package components to carry out surface mounting of the semiconductor package components on a substrate, and relates to a mounting structure with good durability and a manufacturing method therefor.

2. Related Art of the Invention

Conventionally, for a semiconductor package component like a BGA (Ball Grid Array) such that ball electrodes are formed on the undersurface, a durably reliable mounting structure has been realized through reinforcement of the semiconductor package component, for example, (i) by allowing a reinforcement resin such as an under-fill resin or the like to flow into the gap between the semiconductor package component and the substrate so that the resin will be hardened, or (ii) by applying a corner bond adhesive on the edge part of the semiconductor package component so that the adhesive will be hardened.

Each of these methods adopts a step of carrying out reinforcement utilizing an adhesive after solder bonding of a semiconductor package component to a substrate.

On the other hand a mounting method is also known that performs, by applying an adhesive in a step before the reflow step, hardening of the adhesive and solder bonding simultaneously.

FIGS. 10A-10D show an example of such a mounting step, in which the applying step of an adhesive is performed between the mount step of a semiconductor package component and the reflow step (see, for example, Japanese Patent Laid-Open No. 2010-258173).

In FIGS. 10A and 10B, a semiconductor package component 3 is mounted on cream solder 5 applied on electrodes 2 of a substrate 1 so that ball electrodes 4 of the semiconductor package component 3 abut thereon.

In FIG. 10C, a heat-hardening resin 9 is applied so as to join the substrate 1 to the semiconductor package component 3.

Moreover, in FIG. 10D, the substrate 1 with the semiconductor package component 3 mounted, on which the heat-hardening resin 9 has been applied, goes through reflow treatment. When the reflow treatment is performed, the metal of the ball electrodes 4 and the cream solder 5 are melted and mixed to become a bonding metal 7. At this point, since the heat-hardening resin 9, which is a heat-hardening resin, is in an unhardened state, the semiconductor package component 3 moves to an appropriate position owing to a self-alignment effect of solder of the melted bonding metal 7 being sandwiched between the electrodes 2 of the substrate 1 and the electrodes on the side of the semiconductor package component 3.

After the heat-hardening resin 9 is further heated to be hardened, the solder of the bonding metal 7 cooled to a temperature below the solder melting point is solidified, and the electric connection of the semiconductor package component 3 to the substrate 1 and the mechanical link between them are completed via one heating step.

SUMMARY OF THE INVENTION

However, there are problems with the conventional manufacturing methods described above, which will be described in the following. Namely, FIG. 11 shows a sectional view of bonding in the state where the mounting is completed, which is obtained in a case when the semiconductor package component 3 with height H1 (see FIG. 10) of 0.7 mm or more is mounted on the electrodes 2 of the substrate 1, the heat-hardening resin 9 is applied via one step, and heating or the like is carried out. Here, the reference numeral 90 denotes a heat-hardening resin part of the heat-hardening resin 9 that has been hardened.

In a mounting method of FIG. 10, when the height H1 of the semiconductor package component 3 is 0.7 mm or more and thus so large, the heat-hardening resin 9 is required in large quantities to be applied stably so that the upper part of the semiconductor package component 3 and the substrate 1 are connected together. As a result, since the heat-hardening resin 9 gets in contact with the ball electrodes 4 or the bonding metal 7, there are cases where, in process of solidification of the melted solder, the unhardened heat-hardening resin 9 is mixed together with the cream solder 5 that is about to be melted (see FIG. 11), and quality of soldering is decreased greatly due to generation of solder balls, distorted deformation of a solder bonding part after heating and cooling or the like.

Moreover, as shown in FIG. 11, there are also cases where this heat-hardening resin 9 also proceeds to cover a solder bonding part of an electronic component 10 on the substrate 1, which is adjacent to the semiconductor package component 3, and bad mounting quality follows due to similar generation of solder balls, a bad shape of the solder bonding part or the like.

The present invention, in view of such problems of a conventional mounting method for a semiconductor package component, provides a mounting structure of a semiconductor package component and a manufacturing method therefor, which are capable of ensuring, while maintaining quality of solder bonding stably, the mechanical link between the semiconductor package component and a substrate, and obtaining strength with durability.

The $1^{st}$ aspect of the present invention is a manufacturing method for a mounting structure of a semiconductor package component, comprising:

mounting the semiconductor package component on a substrate in such a manner that an electrode of the substrate and an electrode of the semiconductor package component are brought into contact with each other through an applied solder;

applying a first adhesive with viscosity $\eta 1$ and a thixotropy index T1 on a part of the substrate, which is placed a periphery part of the semiconductor package component;

applying a second adhesive with viscosity $\eta 2$ and a thixotropy index T2 on the first adhesive, the second adhesive sitting on the periphery part of the semiconductor package component; and allowing the applied solder to go through reflow treatment and curing the first and second adhesives, wherein the first and second adhesives satisfy $30 \leq \eta 2 \leq \eta 1 \leq 300$ (Pa·s) and $3 \leq T2 \leq T1 \leq 7$, and a sectional area S1 of a cured first adhesive and a sectional area S2 of a cured second adhesive with respect to a direction perpendicular to a mounting surface of the substrate satisfy $S1 \leq S2$.

The $2^{nd}$ aspect of the present invention is a manufacturing method for a mounting structure of a semiconductor package component according to the $1^{st}$ aspect of the present invention, wherein resin components of the first and second adhesives have same polymer compositions.

The 3rd aspect of the present invention is a manufacturing method for a mounting structure of a semiconductor package component according to the 1st aspect of the present invention, wherein a difference between a solubility parameter P1 of the first adhesive and a solubility parameter P2 of the second adhesive is 1.4 or less.

The 4th aspect of the present invention is a mounting structure of a semiconductor package component, comprising:

a substrate that has a substrate electrode;

a semiconductor package component that is mounted on the substrate and has a component electrode abutting against the substrate electrode;

a cured first adhesive that is formed from a first adhesive on a part of the substrate, which is placed a periphery part of the semiconductor package component; and a cured second adhesive that is formed from a second adhesive on the cured first adhesive, the cured second adhesive sitting on the periphery part of the semiconductor package component, wherein viscosity η1 and a thixotropy index T1 of the first adhesive and viscosity η2 and a thixotropy index T2 of the second adhesive satisfy 30≤η2≤η1≤300 (Pa·s) and 3≤T2≤T1≤7, and a sectional area S1 of the cured first adhesive and a sectional area S2 of the cured second adhesive with respect to a direction perpendicular to a mounting surface of the substrate satisfy S1≤S2.

The 5th aspect of the present invention is a mounting structure of a semiconductor package component according to the 4th aspect of the present invention, wherein resin components of the first and second adhesives have same polymer compositions.

The 6th aspect of the present invention is a mounting structure of a semiconductor package component according to the 4th aspect of the present invention, wherein a difference between a solubility parameter P1 of the first adhesive and a solubility parameter P2 of the second adhesive is 1.4 or less.

The present invention can realize a mounting structure of a semiconductor package component and a manufacturing method therefor, which are capable of ensuring, while maintaining quality of solder bonding stably, the mechanical link between the semiconductor package component and a substrate, and obtaining strength with durability.

Description of Symbols

| | |
|---|---|
| 1 | substrate |
| 2 | electrode |
| 3 | semiconductor package component |
| 4 | ball electrode |
| 5 | bonding material (cream solder) |
| 6a | first adhesive |
| $6a_1$ | first adhesive |
| $6a_2$ | multi-stage adhesive of second stage |
| $6a_{n-1}$ | multi-stage adhesive of n-1th stage |
| 6b | second adhesive |
| 7 | bonding metal |
| 8 | virtual line |
| 9 | heat-hardening resin |
| 10 | electronic component |
| H1 | semiconductor package component height |
| S1 | sectional area of adhesive part 60a |
| S2 | sectional area of adhesive part 60b |
| L1 | distance from outer periphery part of semiconductor package component to outside of first adhesive |

PREFERRED EMBODIMENTS OF THE INVENTION

Hereafter, mounting structures of semiconductor package components and manufacturing methods therefor of the present invention are described based on their embodiments.

Embodiment 1

Figure 1:
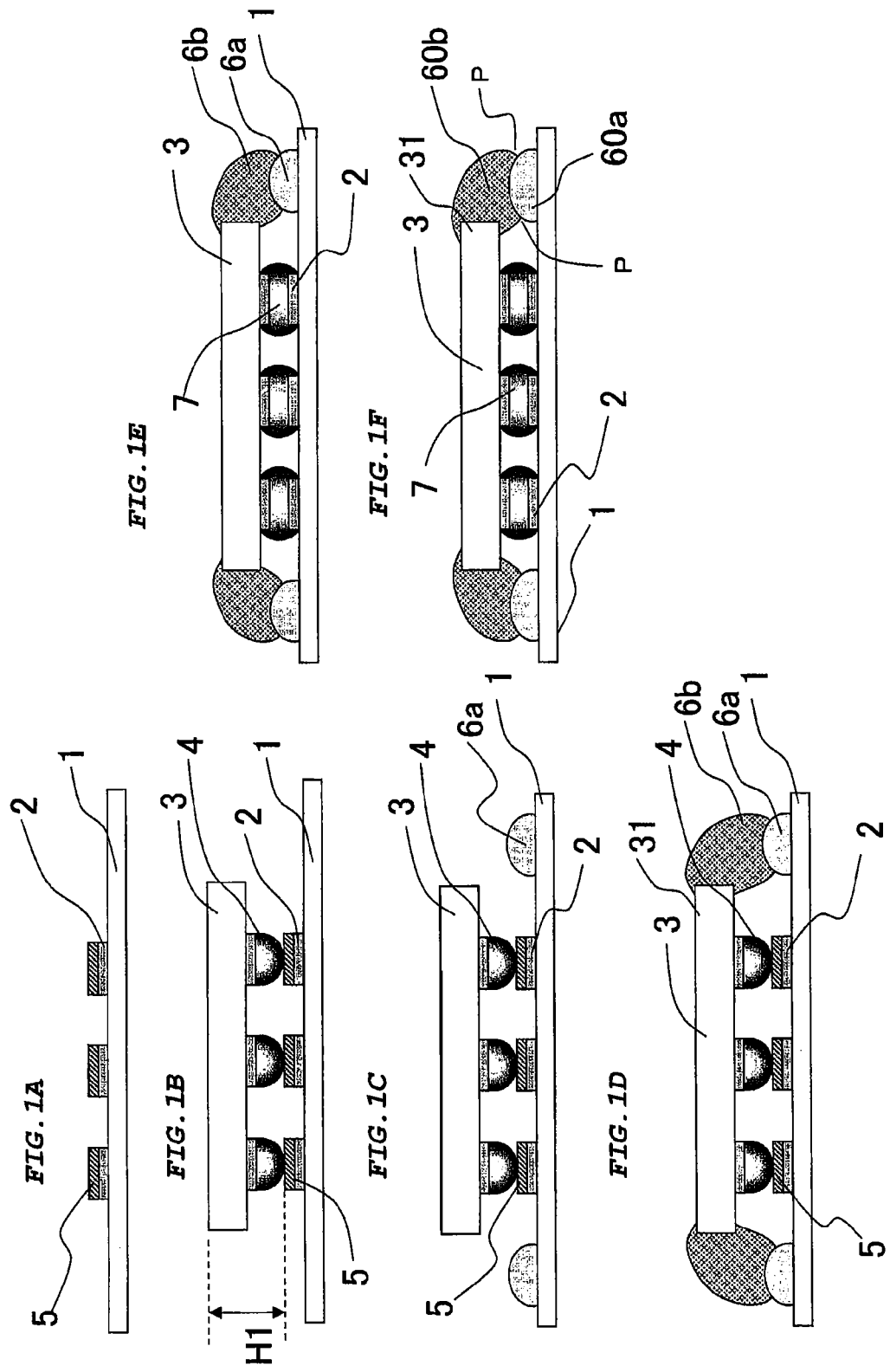
FIGS. 1A-1F are figures for the mounting step of Embodiment 1 of the present invention.

FIGS. 1A-1F show drawings for implementing the steps of a manufacturing method for a mounting structure of the present Embodiment 1 that indicate, respectively, the step of printing the cream solder 5 on the electrodes 2 of the substrate 1 (FIG. 1A), the step of mounting the semiconductor package component 3 having the ball electrodes 4 on the substrate 1 so that the ball electrodes 4 are allowed to abut against the electrodes 2 (FIG. 1B), the step of applying, as the first applying step, a first adhesive 6a (FIG. 1C), the step of applying, as the second applying step, a second adhesive 6b on the first adhesive 6a so that the second adhesive 6b gets in contact with an outer periphery part 31 of the semiconductor package component 3 (FIG. 1D), the step of heating the substrate 1 through a reflow process so that the ball electrodes 4 of the semiconductor package component 3 and the cream solder 5 are melted and mixed to form the bonding metal 7 (FIG. 1E), and the step of hardening the first adhesive 6a and the second adhesive 6b and solidifying the bonding metal 7 (FIG. 1F). The reference numerals 60a and 60b denote adhesive parts of the respective adhesives 6a and 6b that have been hardened. The ball electrode 4 is an example of the electrode of the semiconductor package component of the present invention.

Figure 2:
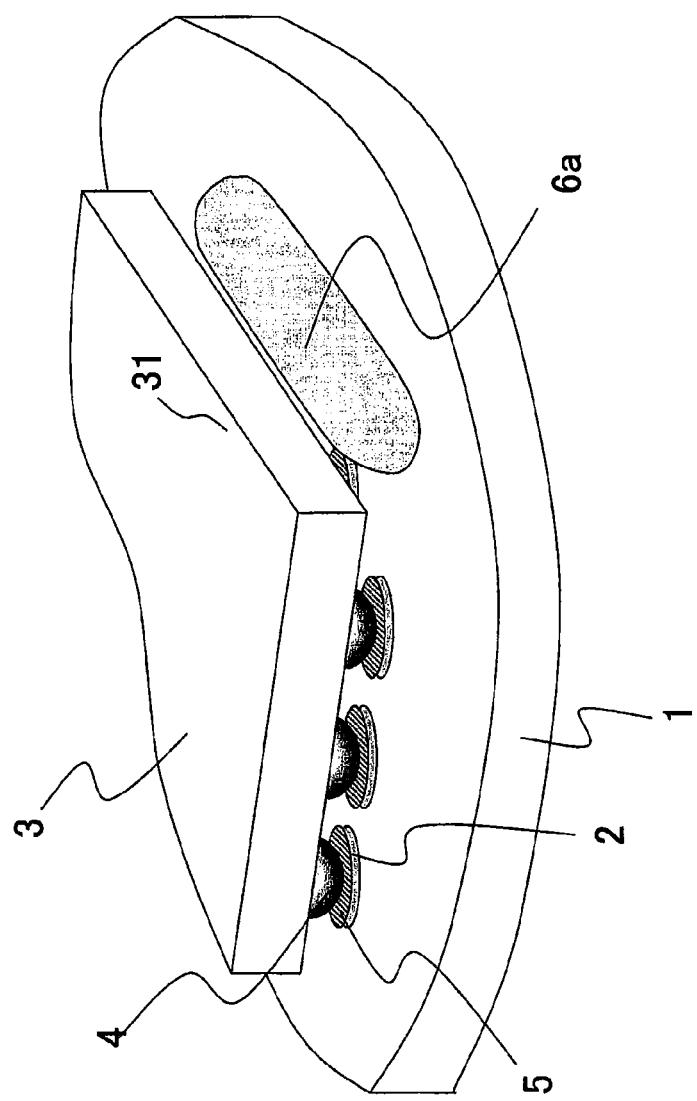
FIG. 2 is a perspective view showing the application state of the first adhesive in the first application of FIG. 1C of Embodiment 1.
Figure 3:
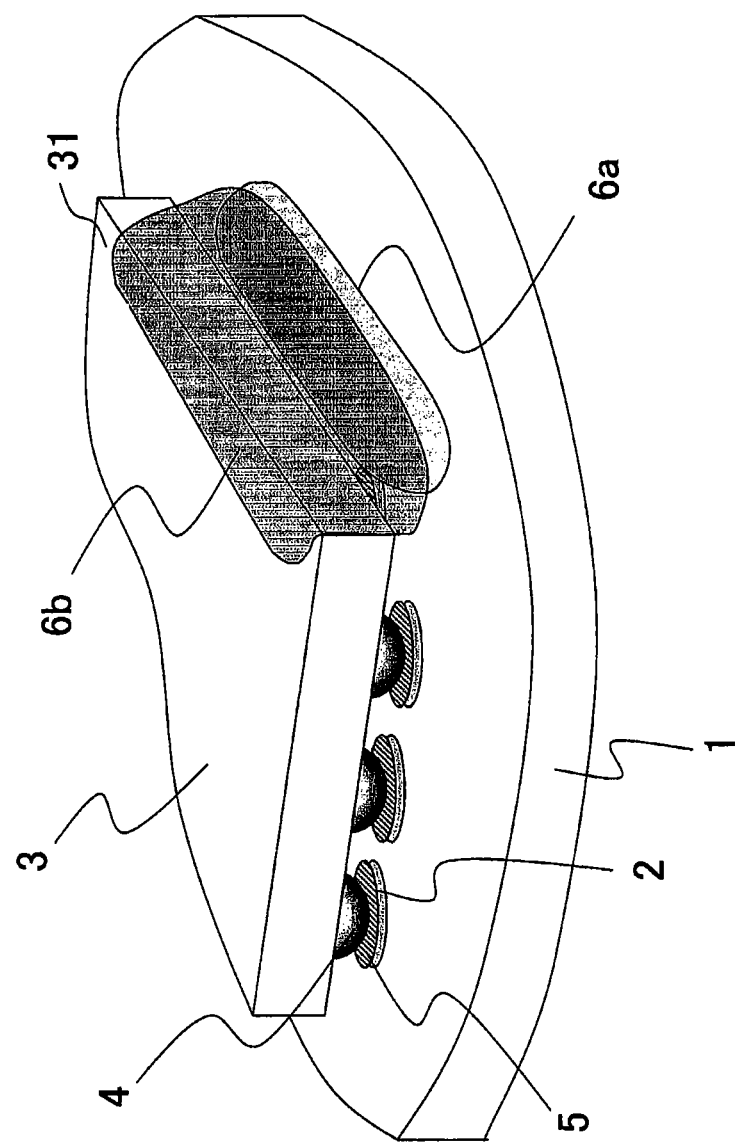
FIG. 3 is a perspective view showing the application state of the second adhesive in the second application of FIG. 1D of Embodiment 1.

Furthermore, FIG. 2 is a perspective view describing the application state after the application of the first adhesive 6a, and FIG. 3 is a perspective view describing the state after the application of the second adhesive 6b thereon.

As concrete material, in FIGS. 1A and 1B, the Sn—Ag—Cu cream solder (EKO SORUDA (Japanese KATAKANA trade mark) M705-GRN360-L60A) 5 produced by Senju Metal Industry Co. Ltd. is, on the electrodes 2 of the substrate 1, printed and applied and, thereon, the BGA-type semiconductor package component (produced by Panasonic; bump pitch: 0.8 mm; and component external form: 13 mm □13 mm) 3 with the height H1 of the semiconductor package component of 0.85 mm (H1 is a sum of the body part thickness of the semiconductor package component 3 and the height of the ball electrode 4) is mounted so that the ball electrodes 4 abut thereon.

In FIG. 1C, on a periphery part of the area in the substrate 1, on which the semiconductor package component 3 has been mounted, as the first applying step, the first adhesive 6a is applied in the shape shown in FIG. 2 so as to be arranged on an outer side of the outer periphery part 31 of the semiconductor package component 3. Moreover, as shown in FIG. 1D, on the upper part of the first adhesive 6a, as the second applying step, the second adhesive 6b is applied as shown in FIG. 3 so as to get in contact with the outer periphery part 31 of the semiconductor package component 3.

Here, in a case where the height H1 of the semiconductor package component 3 is 0.7 mm or less, since, via one applying step (see the Related art of the Invention), the outer periphery part 31 of the semiconductor package component 3 and the substrate 1 can be connected together without contact with bump bonding parts such as the ball electrodes 4 or the like, a method of the present invention is not necessarily required but can be adopted.

Here, general heat-hardening resins can be used as the first adhesive 6a and the second adhesive 6b. Among these, epoxy resins are most suitable that are widely utilized as electronic materials.

Figure 5:
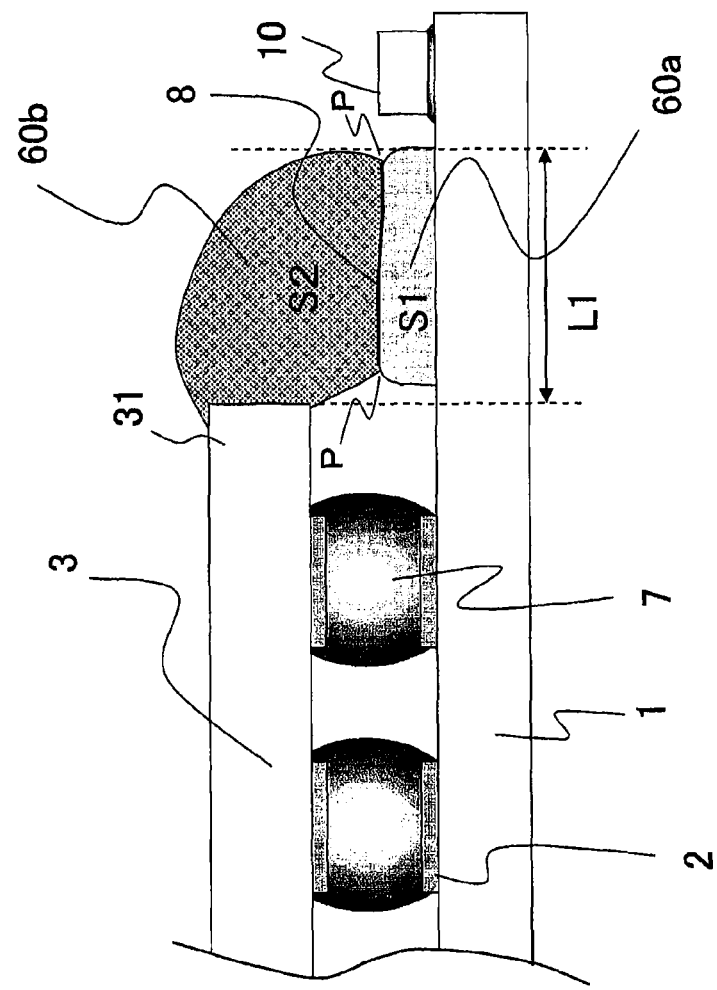
FIG. 5 is a sectional view of the state where the mounting is completed of FIG. 4 in Embodiment 1.

The first adhesive 6a and the second adhesive 6b used in the present Embodiment 1 are only required to have characteristics to form a depression P at the boundary between the adhesives 6a and 6b after application (see FIGS. 1F and 5). Namely, materials are used whose resin viscidity is, for excellent shape retention after application, such that the viscosity measured with an E-type viscometer is 30 Pa·s or more and 300 Pa·s or less, and besides the thixotropy index (the viscosity at 0.5 rpm/the viscosity at 5 rpm) is 3.0 or more and 7.0 or less.

Moreover, since the first adhesive 6a is characterized in that other adhesives are piled up thereon in succession, materials are used such that the viscosity η1 and the thixotropy index T1 of the first adhesive 6a of the first applying step are larger than the viscosity η2 and the thixotropy index T2 of the second adhesive 6b that is utilized for the application to ultimately link the first adhesive 6a to the semiconductor package component 3.

Here, since if the viscosity of the adhesive becomes less than 30 Pa·s, the shape retention force of the paste comes down to cause sagging or weepage is generated, the application shape can not be maintained, and the depression at the boundary between the adhesives 6a and 6b then can not be formed as well, such situations are unfavorable.

Conversely, since if it exceeds 300 Pa·s, a stable discharge from the nozzle becomes impossible while the application painting is carried out, such situations are unfavorable. Furthermore, also for the thixotropy index, since if it becomes less than 3.0, the application shape of the adhesive can not be maintained because the shape retention force of the paste comes down to cause sagging or weepage is generated, and if it exceeds 7.0, thread-forming of the paste becomes intense during the application painting, such situations are unfavorable.

In Embodiment 1, as for the first adhesive 6a, an imidazole hardening agent produced by SHIKOKU CHEMICALS CORPORATION is added to a bisphenol F-type epoxy monomer produced by JER, the viscosity is adjusted with Aerosil, and a heat-hardening resin with viscosity of 190 Pa·s (E-type viscometer produced by TOKI SANGYO/5 rpm) and a thixotropy index of 6.1 (calculated with 0.5 rpm/5 rpm) is used. Furthermore, as for the second adhesive 6b, the same bisphenol F-type epoxy monomer produced by JER is used to which the imidazole hardening agent produced by SHIKOKU CHEMICALS CORPORATION is added, where the viscosity is adjusted with Aerosil, the viscosity is 70 Pa·s (E-type viscometer produced by TOKI SANGYO/5 rpm) and the thixotropy index is 4.9 (calculated with 0.5 rpm/5 rpm).

Furthermore, each of these adhesives 6a and 6b is applied via one step by an application painting means using a screw-type dispenser application machine HDF, which is produced by Panasonic Factory Solutions Co., Ltd.

In the step of FIG. 1E, the substrate 1 on which the adhesives 6a and 6b have been applied is heated through a reflow process. Through reflow treatment, the cream solder 5 and the metal of the ball electrodes 4 are melted and mixed together to become the bonding metal 7 in a melting state. At this stage, since the adhesives 6a and 6b are in an unhardened state, the semiconductor package component 3 moves to an appropriate position owing to a self-alignment effect of the solder that is the melted bonding metal 7 being sandwiched between the electrodes 2 of the substrate 1 and the electrodes of the semiconductor package component 3.

Subsequently, as shown in FIG. 1F, the adhesives 6a and 6b are successively hardened and solidified to become the adhesive parts 60a and 60b before the reflow heating terminates.

Subsequently, the temperature is allowed to be decreased below the solder melting point to solidify the bonding metal 7, the electric connection of the semiconductor package component 3 to the substrate 1 and the mechanical link between them by the adhesive parts 60a and 60b are completed, and the sequential mounting step terminates.

Figure 4:
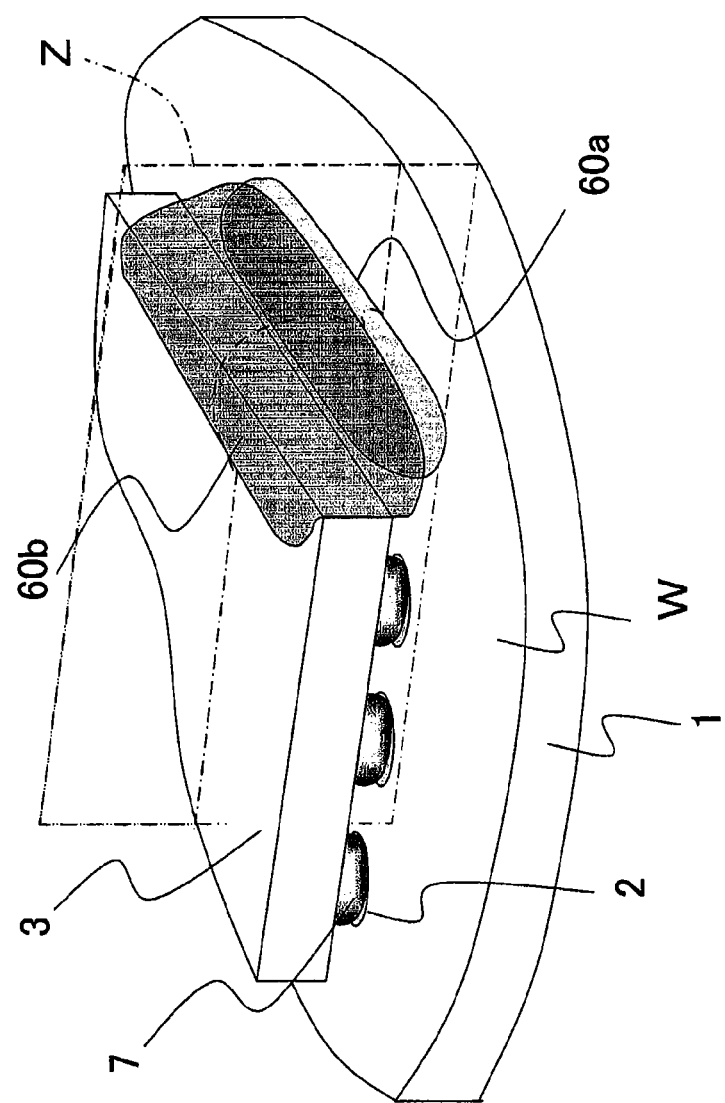
FIG. 4 is a perspective view of the state where the mounting is completed of FIG. 1E in Embodiment 1.

Next, FIG. 4 is a perspective view of the mounting structure the mounting step for which has been completed in this way, and the symbol Z denotes a virtual plane with respect to the direction orthogonal to the mounting surface W of the substrate 1. FIG. 5 is a schematic sectional view of the mounting structure of the present Embodiment 1, taken along the Z plane of FIG. 4. As shown in FIG. 5, the mounting structure of the present Embodiment 1 has a structure such that the adhesive parts 60a and 60b connect, via a two-stage step of the first and second applications, the substrate 1 to the semiconductor package component 3.

Since the adhesives 6a and 6b with the viscosity being 30 Pa·s or more and 300 Pa·s or less and the thixotropy index being 3 or more and 7 or less are used, the two depressions P's in FIG. 5 are formed at the sticking part of the two adhesive parts obtained as the first and second applications, namely, the first adhesive part 60a formed of the hardened first adhesive 6a and the second adhesive part 60b formed of the hardened second adhesive 6b and, in case the respective sectional areas of the adhesive parts 60a and 60b divided by a virtual line 8, which is defined as a line joining these two depressions P's, are denoted by S1 and S2, S1=0.316 mm$^2$ and S2=0.479 mm$^2$, and S1<S2 is satisfied.

By means of this, as shown in FIG. 5, connection from the outer periphery part 31 of the semiconductor package component 3 through the substrate 1 is established by the adhesive parts 60a and 60b, the adhesive parts 60a and 60b in a state of being apart from the bonding metal 7 moreover have excellent quality of soldering, and it is thus possible to stably bond the substrate 1 to the semiconductor package component 3 electrically and besides mechanically.

Moreover, as shown in FIG. 5, the adhesive also does not spread out to wet the solder bonding part of the 1005 chip resistor type electronic component 10, which is adjacent to the outer periphery part 31 of the semiconductor package component 3 at a distance of 1.5 mm, because the distance L1 from the outer periphery part 31 of the semiconductor package component 3 to the outside of the first adhesive part 60a is 1.12 mm. As a result, quality of soldering of the electronic component 10 is excellent as well, and a practical use in high-density mounting patterns is thus possible.

Reliability assessment of the obtained substrate has confirmed conduction through −40/85° C., 1000 cyc heat cycle tests. Moreover, a 6-face drop from a height of 1000 mm has generated no bad conduction through a free-fall drop test with setting in a 110×40 mm box, and reinforcement effect of the adhesive has been confirmed.

In this case, the melting point and solidification starting temperature of the ball electrode 4 and the solder of the cream solder 5 being the bonding material are 217-219° C. and 219° C. respectively, the hardening starting temperatures of the heat-hardening resin materials used for the first adhesive 6a and the second adhesive 6b are both 185° C., and the hardening peak temperatures are 210° C. Furthermore, the thixotrophies of the heat-hardening resin materials used for the adhesives 6a and 6b are acquired from the ratio of the measured viscosity at 0.5 rpm and 5 rpm using an E-type viscometer at 25° C.

In this manner, in the present Embodiment 1, the semiconductor package component 3 is mounted on the substrate 1; while the adhesives are applied throughout the substrate 1 and the end part of the semiconductor package component 3, the adhesive 6a is applied on the outer side of the outer periphery part of the semiconductor package component 3 as the first application, and the adhesive 6b is applied on the upper part thereof so as to connect the adhesive 6a to the outer periphery part of the semiconductor package component 3 as the second application; the ball electrodes 4 and the cream solder 5 are, with the adhesives 6a and 6b being in the unhardened state, subsequently allowed to be melted and mixed to be the bonding metal 7 through the reflow treatment; and after the adhesives 6a and 6b have been hardened, the bonding metal 7 is allowed to be solidified. In such a process, the said adhesives 6a and 6b are arranged so that a relation S1≤S2 is satisfied between the sectional area S1 of the first adhesive part 60a on the first application side and the sectional area S2 of the second adhesive part 60b on the second application side, where partitioning is considered by the virtual line 8 drawn with the line joining the vertexes of the two depressions obtained at the boundary between the first and second applications in the bonding part section in the virtual plane Z with respect to the direction orthogonal to the mounting surface W of the substrate.

In this manner, via separate two stages of application, connection of a substrate to a package component is possible with less total application quantity, compared with the application quantity via one step.

Embodiment 2

Figure 6:
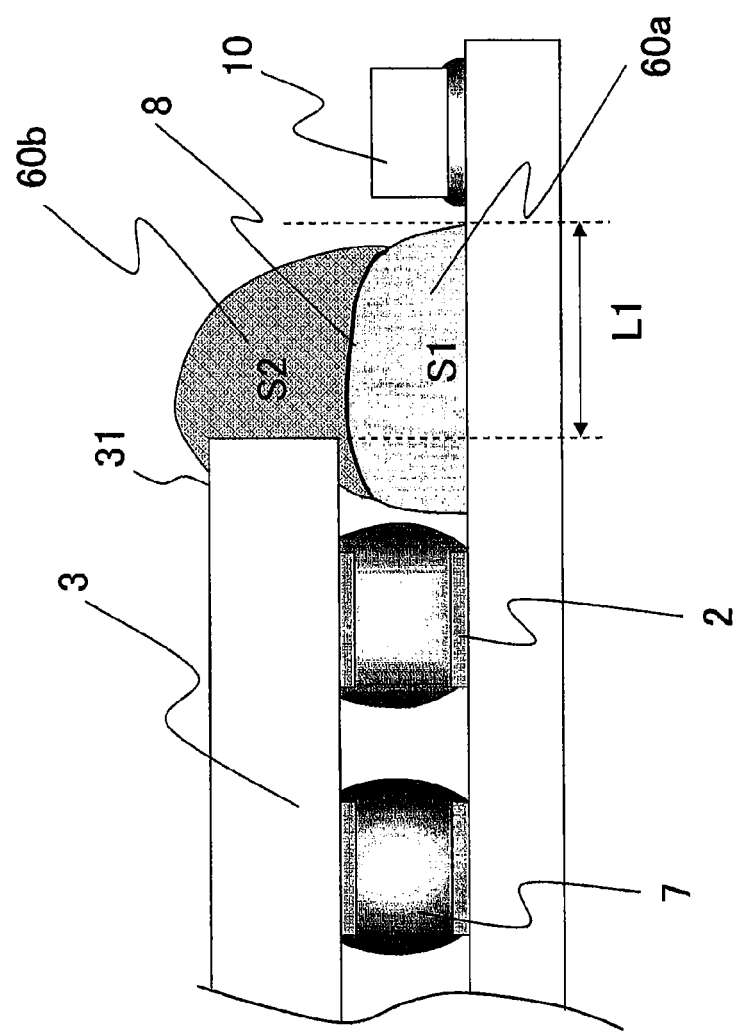
FIG. 6 is a sectional view of the state where the mounting is completed in Embodiment 2, which is obtained in a case when the application quantities of the adhesives of the first and second applications are the same.

FIG. 6 shows Embodiment 2 of the present invention, and a semiconductor package mounting structure has been obtained by a similar method to that of Embodiment 1, except that after the first adhesive 6a has been applied at a predetermined position with application quantity such that the application width is 1.0 mm, and the second adhesive 6b is applied thereon so as to get in contact with the outer periphery part 31 of the semiconductor package component 3 with the same amount in application quantity as the first adhesive 6a. FIG. 6 shows the bonding section of the semiconductor package mounting structure obtained in this way.

The shapes of the first adhesive part 60a and the second adhesive part 60b in the bonding section of the mounting structure the mounting for which has been completed are shown in FIG. 6 and, regarding the respective sectional areas S1 and S2 of the first adhesive part 60a and the second adhesive part 60b divided by the virtual line 8, S1=0.367 mm² and S2=0.372 mm², and S1=S2 is approximately satisfied.

In the semiconductor package mounting structure obtained in this way, connection is established from the outer periphery part 31 of the semiconductor package component 3 through the substrate 1 by the adhesive parts 60a and 60b and, furthermore, the adhesive parts 60a and 60b in a state of being apart from the bonding metal 7 thus have excellent quality of soldering.

Furthermore, the adhesive also has not spread out to wet the solder bonding part of the 1005 chip resistor type electronic component 10, which is adjacent to the outer periphery part 31 of the semiconductor package component 3 at a distance of 1.5 mm, because the distance L1 from the outer periphery part 31 of the semiconductor package component 3 to the edge on the outside of the first adhesive part 60a is 1.30 mm. As a result, quality of soldering of the electronic component 10 is thus excellent as well.

Reliability assessment of the obtained substrate has confirmed conduction through −40/85° C., 1000 cyc heat cycle tests, and there has been no rise in connection resistance values. Moreover, a 6-face drop from a height of 1000 mm has generated no bad conduction through a free-fall drop test with setting in a 110×40 mm box, and reinforcement effect of the adhesive has been realized.

Comparative Example

Figure 7:
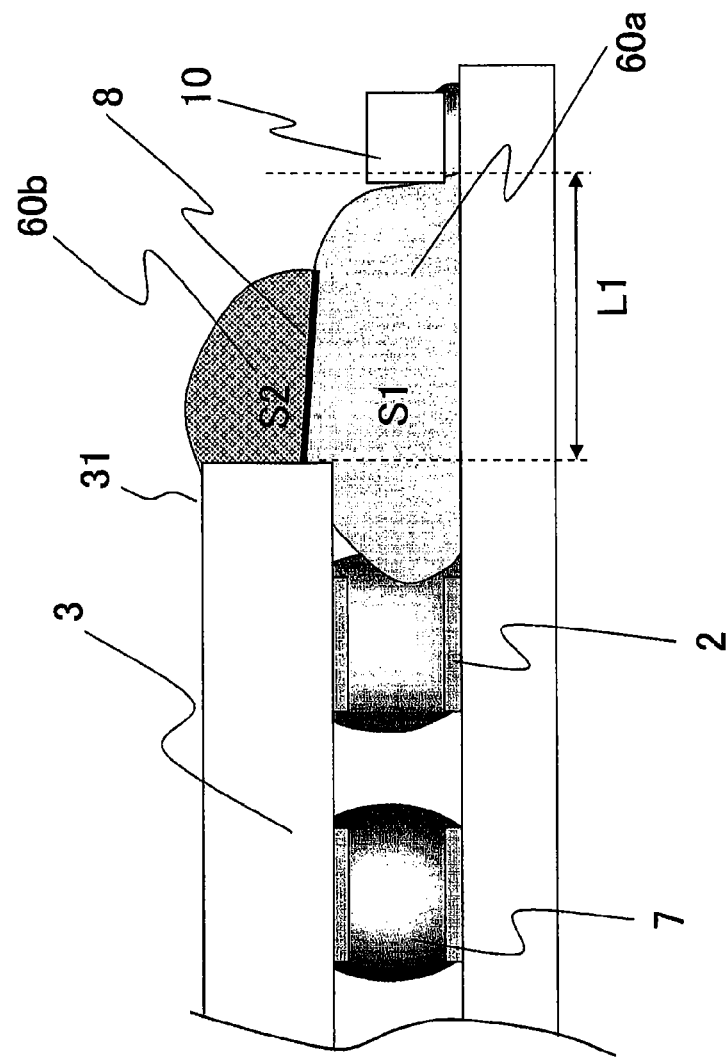
FIG. 7 is a drawing that shows Comparative example, and is a sectional view of the state where the mounting is completed which is obtained in a case when the application quantity of the adhesive of the first application is larger.

FIG. 7 is a figure for describing Comparative example. A semiconductor package mounting structure has been obtained, with adhesives similar to those of Embodiment 1 described above being utilized, by a similar method to that of Embodiment 1, except that after the first adhesive 6a has been applied with application quantity such that the application width is 1.4 mm, and the second adhesive 6b is applied thereon so as to get in contact with the outer periphery part 31 of the semiconductor package component 3 with a small amount. FIG. 7 shows the bonding section of the semiconductor package mounting structure obtained in this way. Here, FIG. 7 shows a sectional view of bonding in the state where the mounting is completed, in a case of S1>S2.

As shown in FIG. 7, regarding the respective sectional areas S1 and S2 of the adhesive parts 60a and 60b in the bonding section of the mounting structure, S1=0.491 mm² and S2=0.132 mm², and thus S1>S2.

In order to join, with the application shape satisfying S1>S2, the substrate 1 to the semiconductor package component 3, it is necessary to allow the application quantity of the adhesive 6a to be large and, in a case where the application is carried out with such a shape, the shape is substantially equal to that of the application via one step.

Namely, since the application quantity of the adhesive 6a is large, the solder is melted in a state where the adhesive 6a is in contact with the bonding metal 7, and the bonding is carried out in a state where the shape of the bonding part is being deformed. Moreover, since the distance L1 from the outer periphery part 31 of the semiconductor package component 3 is no less than 1.59 mm, and the adhesive 6a thus gets in contact with the bonding part of the electronic component 10 as well, which is adjacent at a distance of 1.5 mm, the mounting of the electronic component 10 has been carried out in a state where the solder is shifted.

Furthermore, a reliability test of the substrate the mounting for which has been carried out by such a method indicates, after −40/85° C. 500 cyc heat cycle tests, a connection resistance value being 115% of the initial connection resistance value since the solder bonding part of the semiconductor package component is deformed.

Embodiment 3

The first adhesive 6a is an epoxy adhesive (viscosity: 71 Pa·s; and thixotropy index: 6.5) with a solubility parameter P1 of 10.9, and the second adhesive 6b is an acrylic adhesive (viscosity: 59 Pa·s; and thixotropy index: 5.0) with a solubility parameter P2 of 9.5, namely, a combination of adhesives is thus used such that the difference between the solubility parameters is 1.4. The other manufacturing steps are performed by the same method as that of Embodiment 1 described above, and a semiconductor package mounting structure has been made.

Then, the application width of the first adhesive 6a is 0.90 mm, and the distance from the outer periphery part 31 of the semiconductor package component 3 to the outside of the first adhesive 6a after the application of the second adhesive 6b is 0.95 mm.

Confirmation of the bondability from the section of the obtained mounting structure indicates a mounting sectional shape as shown in FIG. 5. Regarding the respective sectional areas S1 and S2 of the adhesive parts 60a and 60b in the bonding section of the mounting structure the mounting for which has been completed, S1=0.332 mm$^2$ and S2=0.403 mm$^2$, S1<S2 is satisfied, there is no contact with the bonding metal 7 of the semiconductor package component 3, and the bump bonding part thus has excellent quality of soldering.

Furthermore, (the distance L1 from the outer periphery part of the semiconductor package component 3 to the outside of the adhesive)=0.95 mm, and the solder bonding part of the adjacent electronic component 10 has not been influenced as well.

Furthermore, since the difference between the solubility parameters P1 and P2 is 1.4, stickiness of the first and second applications is excellent, conduction through −40/85° C., 1000 cyc heat cycle tests has been confirmed, a 6-face drop from a height of 1000 mm has moreover generated no bad conduction through a free-fall drop test, and effect of strong reinforcement of the substrate 1 and the semiconductor package component 3 has been realized by the adhesives 6a and 6b.

Here, since if the difference between the solubility parameters (SP value) exceeds 1.4, the original objective to carry out reinforcement of the semiconductor package component 3 may not be achieved because the affinity between the adhesives 6a and 6b gets worse and detachment at the interface denoted by the virtual line 8 is caused by thermal expansion and contraction due to a slight shock or temperature change, such situations are unfavorable. Namely, it is most suitable to change only the viscidity by addition of filler or the like using materials with the difference between the solubility parameters being as close to 0 as possible, and more preferably materials of the same material composition.

Figure 8:
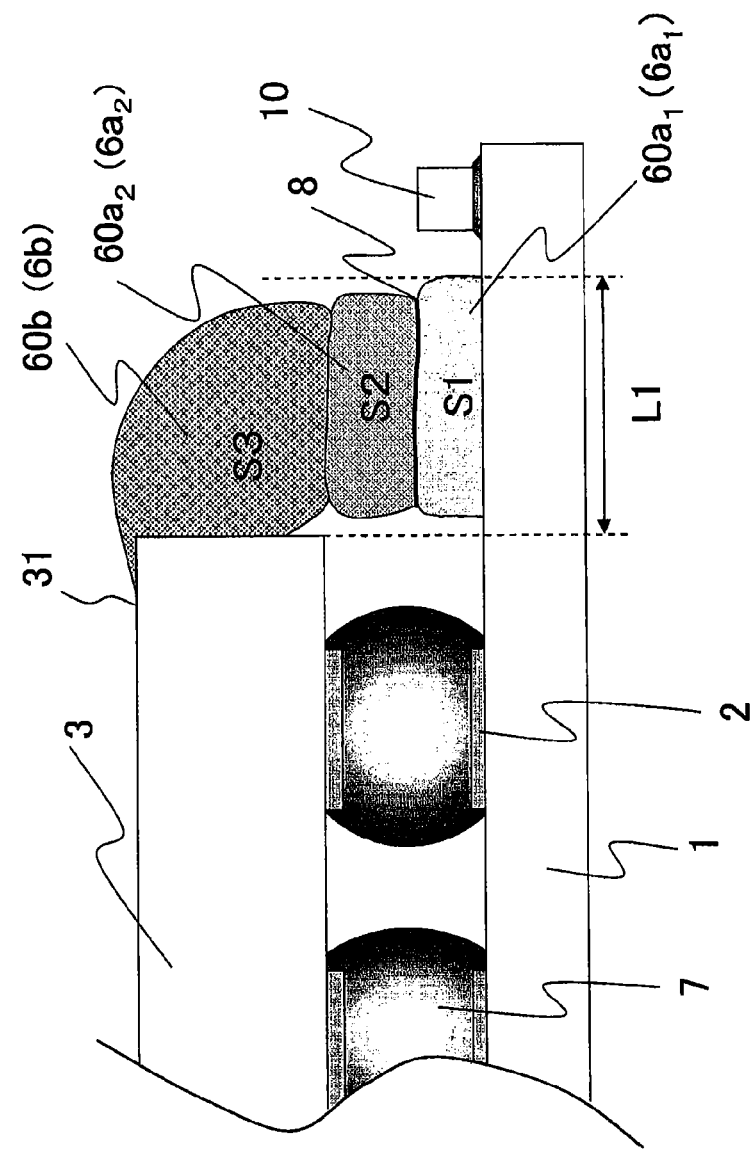
FIG. 8 is a sectional view of the state where the mounting is completed which is obtained in a related example of the present invention.

Next, an example related to the present invention is described. As shown in FIG. 8, in a case where the height H1 of the semiconductor package component 3 is considerably large, it is also desirable to apply the adhesives with multi stages of three or more stages. In the present related example, the height is 1.2 mm.

To begin with, after the semiconductor package component 3 has been mounted, a first adhesive 6a₁ is applied on the periphery thereof using an epoxy adhesive with viscosity η3 of 190 Pa·s and a thixotropy index T3 of 6.1. Then, the application width of the first adhesive 6a₁ is 0.90 mm.

Moreover, on the upper part of the first adhesive 6a₁, a multi-stage adhesive 6a₂ is applied so as to the second stage using the same epoxy adhesive as the first adhesive 6a₁. Then, the application width of the multi-stage adhesive 6a₂ is 0.75 mm.

Subsequently, in such a manner that the multi-stage adhesive 6a₂ is moreover joined to the outer periphery part 31 of the semiconductor package component 3, the second adhesive 6b is applied using an epoxy adhesive with viscosity η4 of 70 Pa·s and a thixotropy index T4 of 4.9. This implies that the application of the adhesives have been performed via three steps in total.

The other manufacturing steps are performed by the same method as that of Embodiment 1 to make a mounting structure of a semiconductor package component, and the section of the obtained mounting structure thus has a multi-stage structure as shown in FIG. 8. Here, the reference numeral 60a₁ denotes a first adhesive part of the first adhesive 6a₁ that has been hardened, the reference numeral 60a₂ denotes a multi-stage adhesive part of the multi-stage adhesive 6a₂ that has been hardened, and the reference numeral 60b denotes the second adhesive part of the second adhesive 6b that has been hardened.

The present related example is for bonding section structure such that the semiconductor package component 3 and the substrate 1 have been stuck together in a state where the same material as that of the first adhesive 6a is applied in Step 2 and the second adhesive 6b is applied in Step 3 and, regarding the relation between the sectional area S1 of the adhesive part 60a₁ of the first application of the first stage in the bonding section of the mounting structure the mounting for which has been completed, and the sectional area (S2+S3) obtained by adding the sectional area S2 of the multi-stage adhesive part 60a₂ of the second application and the sectional area S3 of the second adhesive part 60b of the third application, S1=0.342 mm$^2$ and S2+S3=0.645 mm$^2$, and S1<S2+S3 is satisfied.

This implies that the first adhesive 6a₁ is not in contact with the bonding metal 7 of the semiconductor package component 3 and the bump bonding part has excellent quality of soldering and, moreover, since (the distance L1 from the outer periphery part 31 of the semiconductor package component 3 to the outside of the first adhesive 6a₁)=0.95 mm, the solder bonding part of the adjacent electronic component 10 has not been influenced as well.

Moreover, since strong reinforcement of the substrate 1 and the semiconductor package component 3 is given by the adhesive parts 60a₁, 60a₂, and 60b, there has been little change in the connection resistance value even through −40/85° C., 1000 cyc heat cycle tests. Furthermore, a 6-face drop from a height of 1000 mm has generated no bad conduction through a free-fall drop test, and reinforcement effect of the adhesives has been realized.

Figure 9:
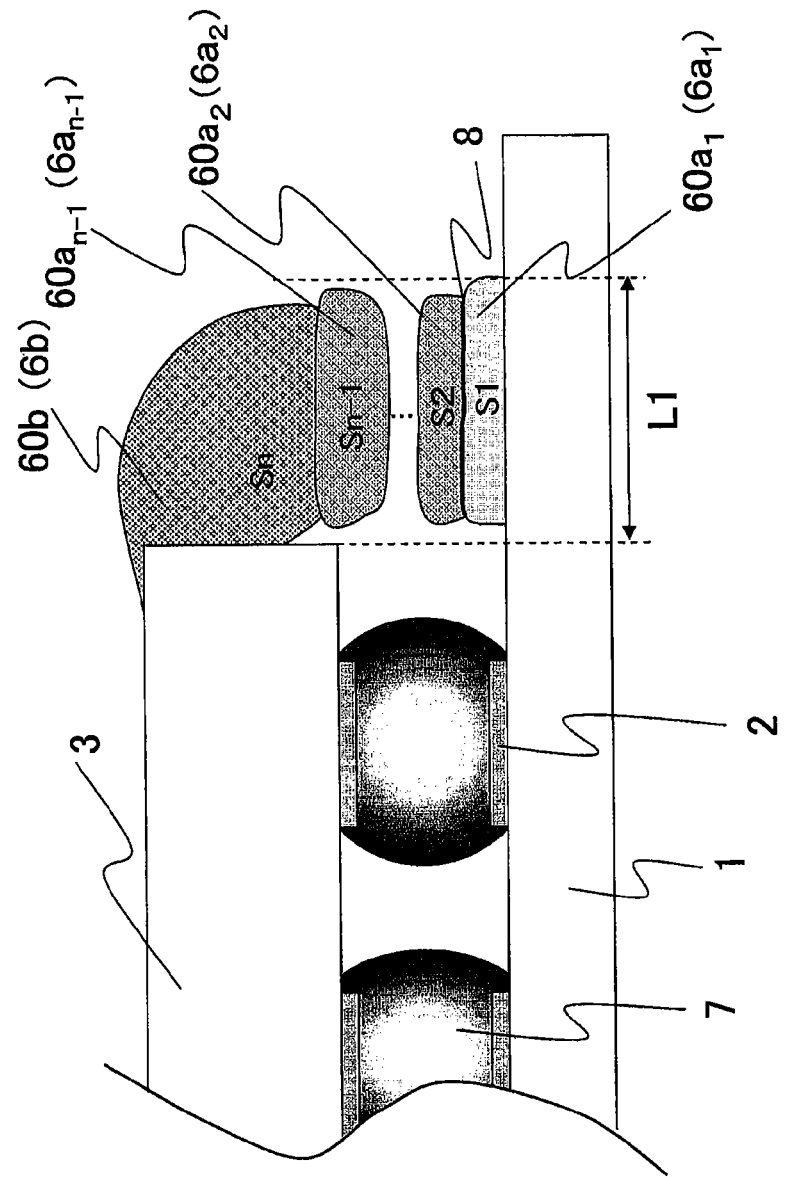
FIG. 9 is a sectional view of the state where the mounting is completed which is obtained in a related example of the present invention.
Figure 10:
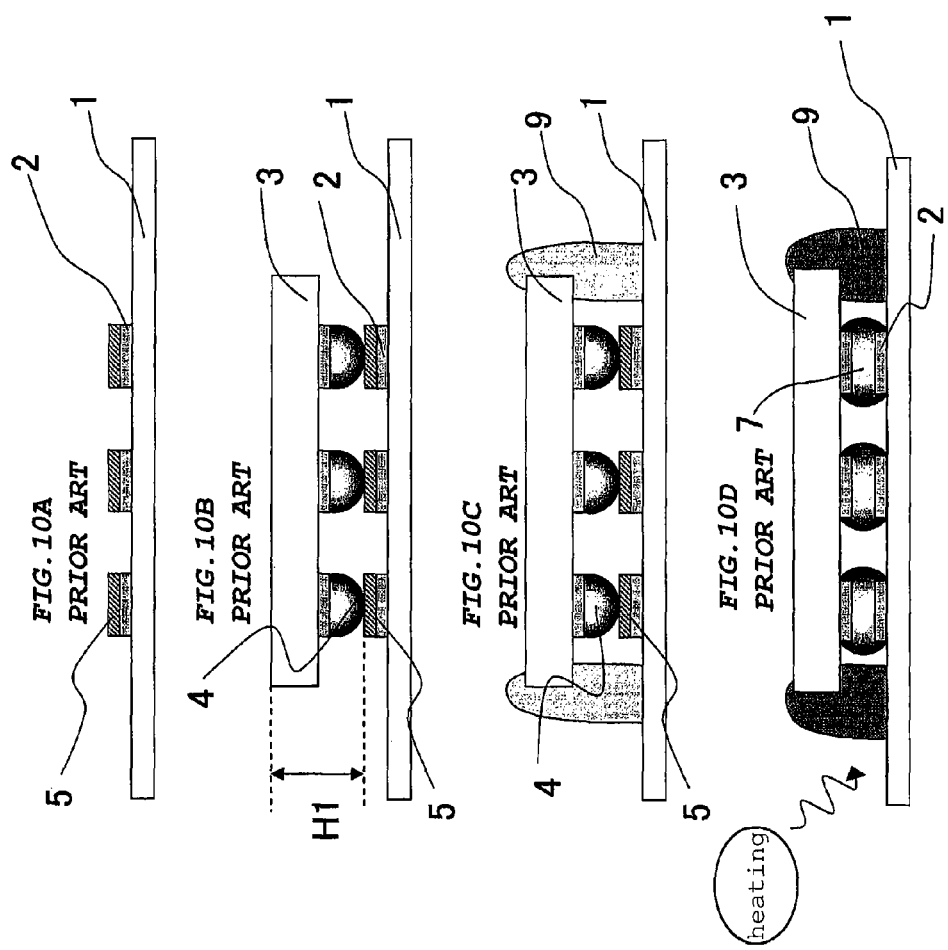
FIGS. 10A-10D are figures for the steps of a conventional mounting method.
Figure 11:
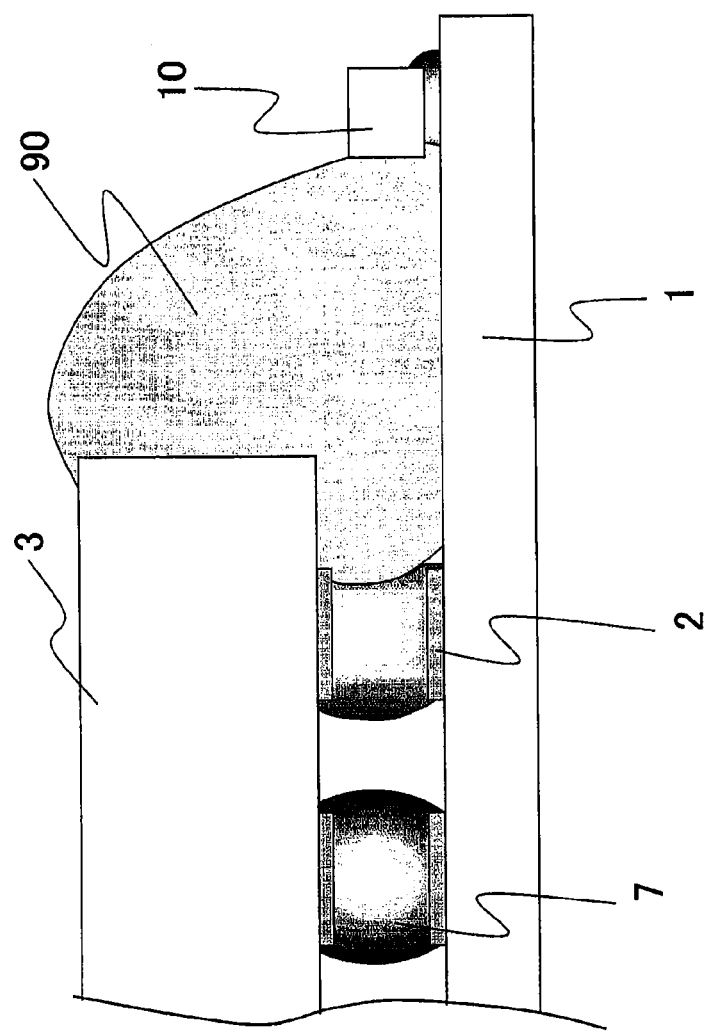
FIG. 11 is a sectional view of the state where the mounting is completed which is obtained in a case when the application quantity of the adhesive is large in a conventional mounting method.

Further, in a case where the thickness of the semiconductor package component 3 is still larger, and it is impossible to bond the substrate 1 to the semiconductor package component 3 mechanically with the application of the adhesives via three steps described above, the number of steps may be still more increased. FIG. 9 shows a case of an application via n steps.

Namely, as shown in FIG. 9, after the adhesive $6a_1$ (viscosity: $\eta3$; and thixotropy index: T3) has been applied as the first application, the multi-stage adhesive $6a_2$ (viscosity: $\eta3$; and thixotropy index: T3) is applied thereon with the same application width as that of the first application so as to be piled. In a state where an application height of the adhesive is obtained by repeating this operation as needed, the application of the second adhesive 6b (viscosity: $\eta4$; and thixotropy index: T4) is performed so that the outer periphery part 31 of the semiconductor package component 3 and a multi-stage adhesive $6a_{n-1}$ of the uppermost stage through the applications piled successively are, with the ultimate nth application, linked together.

Then, when the sectional area of the first adhesive part $60a_1$ of the first adhesive $6a_1$ that has been applied in Step 1 and hardened is denoted by S1, the sectional areas of the multi-stage adhesive parts $60a_2$, $60a_3$, . . . , and $60a_{n-1}$ of the multi-stage adhesives $6a_2$, $6a_3$, . . . , and $6a_{n-1}$ that have been applied in Steps 2 through n–1 and hardened are denoted by S2, S3, . . . , and Sn–1, respectively, and the sectional area of the second adhesive part 60b of the second adhesive 6b that has been applied in Step n and hardened is denoted by Sn, the application quantities of the respective adhesives are adjusted so as to satisfy S1≤S2+S3+ . . . +Sn–1+Sn between these sectional areas.

Next, the conditions and results of Embodiments 1-3, Comparative example and the related example are set forth in Table 1.

TABLE 1

| | S1 | S2 | $\eta1$ | $\eta2$ | T1 | T2 | P1 | P2 | L1 | Assessment |
|---|---|---|---|---|---|---|---|---|---|---|
| Embodiment 1 | 0.316 | 0.479 | 190 | 70 | 6.1 | 4.9 | 10.9 | 10.9 | 1.12 | good |
| Embodiment 2 | 0.367 | 0.372 | 190 | 70 | 6.1 | 4.9 | 10.9 | 10.9 | 1.30 | good |
| Comparative example | 0.491 | 0.132 | 190 | 70 | 6.1 | 4.9 | 10.9 | 10.9 | 1.59 | poor |
| Embodiment 3 | 0.332 | 0.403 | 71 | 59 | 6.5 | 5.0 | 10.9 | 9.5 | 0.95 | good |
| Related example (Case of FIG. 8) (S2 in Table 1 is (S2 + S3) in FIG. 8) | 0.342 | 0.645 | 190 | 70 | 6.1 | 4.9 | 10.9 | 10.9 | 0.95 | good |

Further, in Table 1, the related example is for a case of three stages, and S2 means (S2+S3). Besides, in a case of n stages, S2 means (S2+ . . . +Sn–1+Sn).

Here, the assessment in Table 1 has been made from (a) the mountability concerning the quality of soldering of the semiconductor package component 3 and the adjacent electronic component 10, and (b) the reliability in heat cycle tests and drop tests, where "good" represents one that satisfies both of the two, and "poor" represents one that does not satisfy either or both.

Further, in the present invention, in a case of a material with $\eta1$=$\eta2$, T1=T2 and besides P1=P2, a two-stage application with same materials is meant.

In an actual method of use, a multi-stage application with same materials (same polymer compositions) is efficient for the production. In addition, a material property such as viscosity or the like is varied. Thereupon, sagging is suppressed, the application quantity is lowered, and a use in high-density mounting is possible.

The above-described application of the adhesives does not need to be performed on all the outer periphery part of the semiconductor package component. For example, the adhesive may be applied on the four corners, or may be applied on the respective parts of the edges with the length of each part being about one third of the length of the edge. Even in a case where the adhesives are applied in such manners, it is possible to obtain strength with durability by ensuring the mechanical link between the semiconductor package component and a substrate.

The present invention is effective in mounting engineering method for carrying out reinforcement of a high semiconductor package component with adhesives while reducing the number of heating steps to make a mounted substrate that is eminent in drop/vibration reliability, in component mounting/assembly of electronic substrates and the like of (A) various electronic devices such as mobile devices that may suffer drop impacts, (B) vehicles, (C) aircrafts or the like, which may suffer vibration impacts.

What is claimed is:

1. A manufacturing method for a mounting structure of a semiconductor package component, comprising:
    mounting the semiconductor package component on a substrate in such a manner that an electrode of the substrate and an electrode of the semiconductor package component are brought into contact with each other through an applied solder;
    applying a first adhesive with viscosity $\eta1$ and a thixotropy index T1 on a part of the substrate, which is placed a periphery part of the semiconductor package component;
    applying a second adhesive with viscosity $\eta2$ and a thixotropy index T2 on the first adhesive, the second adhesive sitting on the periphery part of the semiconductor package component; and
    allowing the applied solder to go through reflow treatment and curing the first and second adhesives, wherein
    the first and second adhesives satisfy 30≤$\eta2$≤$\eta1$≤300 (Pa·s) and 3≤T2≤T1≤7,
    a sectional area S1 of a cured first adhesive and a sectional area S2 of a cured second adhesive with respect to a direction perpendicular to a mounting surface of the substrate satisfy S1≤S2, and
    a difference between a solubility parameter P1 of the first adhesive and a solubility parameter P2 of the second adhesive is 1.4 or less.

2. A manufacturing method for a mounting structure of a semiconductor package component according to claim 1, wherein
    resin components of the first and second adhesives have same polymer compositions.

3. A mounting structure of a semiconductor package component, comprising:
    a substrate that has a substrate electrode;
    a semiconductor package component that is mounted on the substrate and has a component electrode abutting against the substrate electrode;

a cured first adhesive that is formed from a first adhesive on a part of the substrate, which is placed a periphery part of the semiconductor package component; and a cured second adhesive that is formed from a second adhesive on the cured first adhesive, the cured second adhesive sitting on the periphery part of the semiconductor package component, wherein viscosity $\eta 1$ and a thixotropy index T1 of the first adhesive and viscosity $\eta 2$ and a thixotropy index T2 of the second adhesive satisfy $30 \leq \eta 2 \leq \eta 1 \leq 300$ (Pa·s) and $3 \leq T2 \leq T1 \leq 7$, a sectional area S1 of the cured first adhesive and a sectional area S2 of the cured second adhesive with respect to a direction perpendicular to a mounting surface of the substrate satisfy S1≤S2, and a difference between a solubility parameter P1 of the first adhesive and a solubility parameter P2 of the second adhesive is 1.4 of less.

4. A mounting structure of a semiconductor package component according to claim 3, wherein resin components of the first and second adhesives have same polymer compositions.

* * * * *